(12) United States Patent
Song et al.

(10) Patent No.: US 11,088,177 B2
(45) Date of Patent: Aug. 10, 2021

(54) ARRAY SUBSTRATE AND MANUFACTURING METHOD THEREOF

(71) Applicant: Shenzhen China Star Optoelectronics Semiconductor Display Technology Co., Ltd., Shenzhen (CN)

(72) Inventors: Liwang Song, Shenzhen (CN); Zhaohui Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 345 days.

(21) Appl. No.: 16/321,464

(22) PCT Filed: Sep. 27, 2018

(86) PCT No.: PCT/CN2018/108068
§ 371 (c)(1),
(2) Date: Jan. 29, 2019

(87) PCT Pub. No.: WO2020/019492
PCT Pub. Date: Jan. 30, 2020

(65) Prior Publication Data
US 2021/0118908 A1   Apr. 22, 2021

(30) Foreign Application Priority Data

Jul. 23, 2018   (CN) .......................... 201810813280.6

(51) Int. Cl.
*H01L 27/12* (2006.01)
*G02F 1/1362* (2006.01)

(52) U.S. Cl.
CPC ...... *H01L 27/124* (2013.01); *G02F 1/136222* (2021.01); *G02F 1/136286* (2013.01); *H01L 27/1259* (2013.01)

(58) Field of Classification Search
CPC ............. H01L 27/124; G02F 1/136286; G02F 1/136222
See application file for complete search history.

(56) References Cited

FOREIGN PATENT DOCUMENTS

| CN | 104122715 A | * 10/2014 |
|---|---|---|
| CN | 104297996 A | 1/2015 |

(Continued)

*Primary Examiner* — Cuong Q Nguyen
*Assistant Examiner* — Peter M Albrecht
(74) *Attorney, Agent, or Firm* — Leong C. Lei

(57) ABSTRACT

The invention provides an array substrate and manufacturing method thereof. The array substrate comprises: a substrate; a plurality of data lines and scan lines disposed on one side of the substrate, the data lines and the scan lines defining a plurality of sub-pixel areas, the data lines and the scan lines being mutually insulated, the data lines extending in a first direction and being arranged in a second direction crossing the first direction, the scan lines extending in the second direction and being arranged in the first direction; a color-resist layer disposed on the same side of the substrate with the data lines and the scan lines, the color-resist layer comprising a plurality of color-resists, and two adjacent color-resists of the plurality of color-resists having an overlapping area corresponding to an area of a respective one of the data lines; a data black matrix (BM) saving (DBS) common electrode wire extending in the first direction and disposed on a side of the overlapping area of the color-resist layer away from the substrate to shield a data line of the plurality of data lines, and uniform slits disposed at an edge of the DBS common electrode wire in plan view, the uniform slits extending in the second direction and being arranged in the first direction.

7 Claims, 4 Drawing Sheets

(56) References Cited

FOREIGN PATENT DOCUMENTS

| | | |
|---|---|---|
| CN | 104375313 A | 2/2015 |
| CN | 106019748 A | 10/2016 |

\* cited by examiner

ARRAY SUBSTRATE AND MANUFACTURING METHOD THEREOF

BACKGROUND OF THE INVENTION

1. Field of the Invention

The present invention relates to the field of display, and in particular to an array substrate and manufacturing method thereof.

2. The Related Arts

Liquid crystal display (LCD) provides many advantages, such as, thinness, power saving, and no radiation, and has been widely used in, such as, LCD television (TV), mobile phone, personal digital assistant (PDA), digital camera, computer screen or laptop screen.

Generally, an LCD device comprises a housing, a liquid crystal (LC) panel disposed inside the housing, and a backlight module disposed in the housing. The LC panel mainly comprises a thin film transistor (TFT) array substrate, a color filter (CF) substrate, and an LC layer sandwiched between the two substrates. The working principle is that the rotation of the LC molecules of the LC layer is controlled by applying a driving voltage on the two substrates, and the light of the backlight module is refracted to generate an image.

The color filter on array (COA) technology is an integrating technology for directly forming color filter (CF) layers, i.e., red (R), green (G), and blue (B) color-resists on an array substrate. At present, on the COA technology, the data black matrix (BM) saving (DBS) pixel design is also more and more often adopted, covering the Indium Tin Oxide (ITO) wire above the data line, the width of the ITO wire is slightly wider than the data line. These ITO wires and the common electrode (COM) are usually set to equipotential at the voltage. When the panel is in normal operation, the electric fields formed by the ITO wires and the common electrode can keep the LC molecules from being deflected, thereby achieve the shielding function.

The curved panel design of active matrix liquid crystal display (AMLCD) usually adopts DBS design and COA technology to increase the aperture ratio and reduce the parasitic capacitance; however, due to the difference in terrain topography and color-resist leveling, the overlapping regions are often present between adjacent color-resists, bumps are generated at the overlapping regions to form a horn-shaped terrain, and the flatness is deteriorated. The horn-shaped terrain causes a change in the LC polar angle, and the LC is not vertically arranged at the position, so that light leakage occurs at the position where the color-resists overlap, affecting characteristic parameters such as panel chromaticity and contrast.

As shown in FIG. 1A, FIG. 1A is a schematic top view of a conventional array substrate. The array substrate mainly comprises: a substrate (not shown); a plurality of data lines 20 and a plurality of scan lines 10 disposed at one side of the substrate and cross-overly disposed, the plurality of data lines 20 and the plurality of scan lines 10 defining a plurality of sub-pixel areas, the plurality of data lines 20 and the plurality of scan lines 10 being insulated from each other; and a color-resist layer located on the same side of the substrate as the plurality of data lines 20 and the plurality of scan lines 10, the color-resist layer comprising a plurality of color-resists 30, and two adjacent color-resists 30 having overlapping areas corresponding to the data line areas; a DBS common electrode 40 being disposed at a side of the overlapping area of the color-resist layer facing away from the substrate to shield the data line 20.

The TFT array disposed on the substrate mainly comprises lateral scan lines 10 and longitudinal data lines 20, and a color-resist 30 and a pixel electrode (not shown) disposed in the sub-pixel area defined by the intersecting scan lines 10 and the data lines 20, for example, the R, G, B color-resists 30; laterally adjacent color-resists 30 mutually overlapping in the data line area (indicated by a dash line portion in FIG. 1A), and a black matrix 50 being disposed in the scan line area between longitudinally adjacent color-resists 30; a DBS common electrode wire 40 being disposed in parallel above the data line 20, and the DBS common electrode wire 40 being slightly wider than the data lines 20 for achieving shading in the liquid crystal display.

As shown in FIG. 1B, FIG. 1B is a schematic cross-sectional view of the position A-A in FIG. 1A, with the structure not shown in FIG. 1A added. A color-resist 30 is formed on the source 80 of the TFT array, and a DBS common electrode wire 40 and a pixel electrode 60 are disposed on the color-resist 30. The DBS common electrode wire 40 and the common electrode 70 on the opposite substrate are generally set at the same voltage. The equipotential is set so that the LC molecules 90 remain undeflected during operation. Since the color-resists 30 of the two colors overlap at the intersection to cause bump, the LC molecules 90 at the position of the DBS common electrode wire 40 overlapping the color-resists 30 overlap will cause light leakage due to the terrain topography and the electric field or side electric field formed at the position by the upper and lower substrates.

SUMMARY OF THE INVENTION

The object of the present invention is to provide an array substrate and manufacturing method thereof, able to reduce light leakage at intersection of the color-resist and DBS common electrode wire overlapping.

To achieve the above object, the present invention provides an array substrate, which comprises: a substrate;

a plurality of data lines and a plurality of scan lines disposed on one side of the substrate, the plurality of data lines and the plurality of scan lines defining a plurality of sub-pixel areas, the plurality of data lines and the plurality of scan lines being mutually insulated;

a color-resist layer disposed on the same side of the substrate with the plurality of data lines and the plurality of scan lines, the color-resist layer comprising a plurality of color-resists, and two adjacent color-resists having an overlapping area corresponding to the data line area;

a DBS common electrode wire disposed on a side of the overlapping area of the color-resist layer away from the substrate to shield the data line, and uniform slits disposed at an edge of the DBS common electrode wire in parallel with direction of the scan line.

Wherein, the slits are disposed at the edge of a side of the DBS common electrode wire.

Wherein, the slits are disposed at the edges of both sides of the DBS common electrode wire.

Wherein, the slits are symmetrically disposed at the edges of both sides of the DBS common electrode wire.

Wherein, the slits are asymmetrically disposed at the edges of both sides of the DBS common electrode wire.

Wherein, longitudinal distribution ranges of the slits on both sides of the DBS common electrode wire are merged to cover the sub-pixel area where the DBS common electrode wire is located.

Wherein, the sub-pixel area is disposed with a pixel electrode.

The present invention also provides a manufacturing method of array substrate, which comprises:

providing a substrate, forming a thin film transistor (TFT) array on one side of the substrate; forming a color-resist on a passivation layer of the TFT array; forming a via on the color-resist; forming an indium-tin-oxide (ITO) film on the color-resist, patterning the ITO film to form a pixel electrode and a DBS common electrode wire, and an edge of the DBS common electrode wire being disposed with uniform slits in parallel with direction of the scan line; the pixel electrode being connected to a drain of the TFT array through the via.

Wherein, the step of forming a TFT array on one side of the substrate comprises:

forming a gate metal layer on the substrate and patterning the gate metal layer to obtain a gate;

forming a gate insulating layer on the gate and the substrate;

forming an active layer on the gate insulating layer;

forming an ohmic contact layer on the active layer;

forming a source/drain metal layer on the ohmic contact layer and patterning the source/drain metal layers to obtain a source and a drain;

forming a passivation layer on the source and the drain.

In summary, the array substrate and the manufacturing method thereof of the present invention can reduce light leakage at the DBS common electrode wire overlapping the color-resist, improve color gamut and contrast, and improve product quality.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1A:
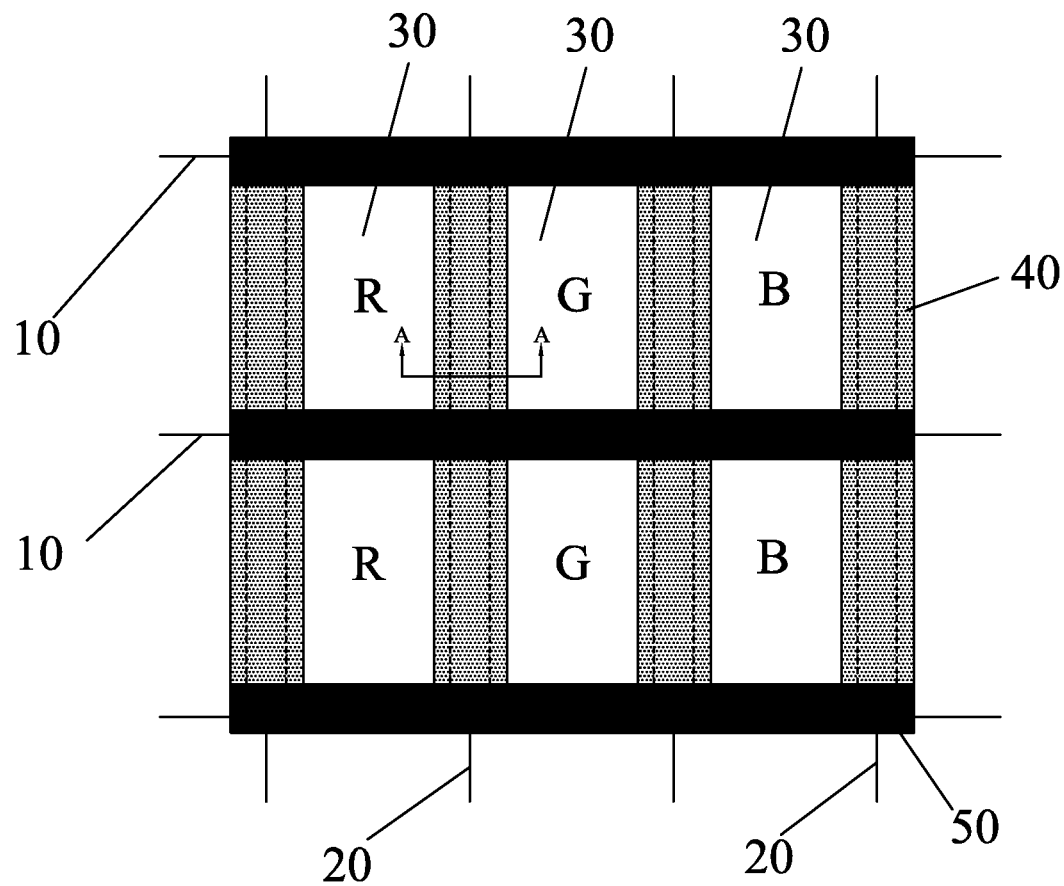
FIG. 1A is a schematic top view of a known array substrate.
Figure 1B:
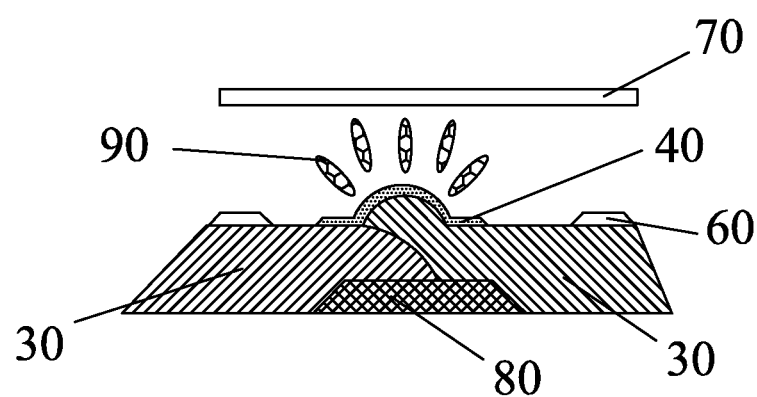
FIG. 1B is a schematic cross-sectional view of A-A position in FIG. 1A.
Figure 2A:
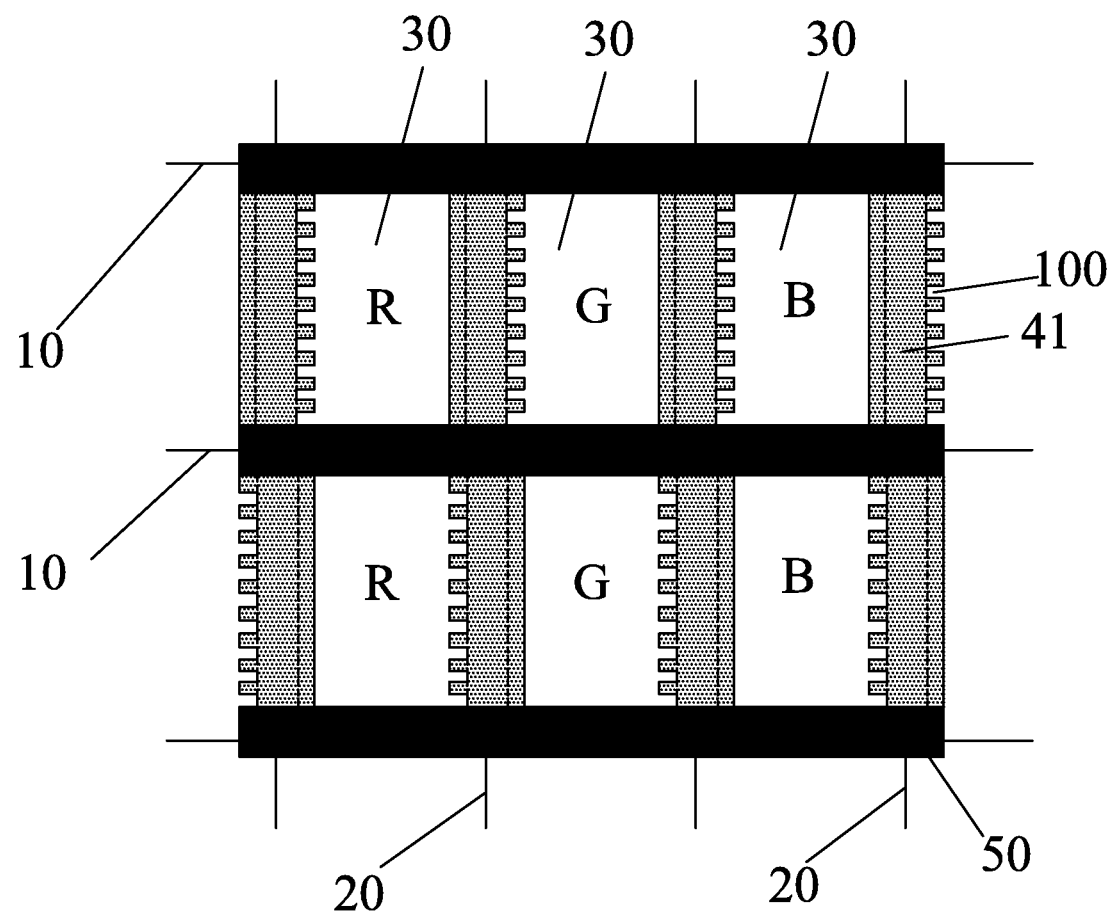
FIG. 2A is a schematic top view of an array substrate of a preferred embodiment of the present invention.
Figure 2B:
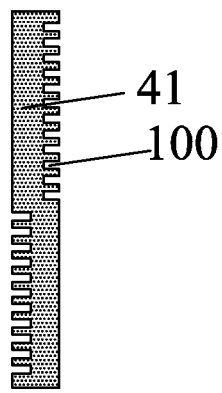
FIG. 2B is a schematic view showing the pattern of the DBS common electrode wire in FIG. 2A.

Refer to FIG. 2A and FIG. 2B. FIG. 2A is a schematic top view of an array substrate of a preferred embodiment of the present invention; FIG. 2B is a schematic view showing the pattern of the DBS common electrode wire in FIG. 2A. The array substrate of the preferred embodiment mainly comprises: a substrate (not shown); a plurality of data lines 20 and a plurality of scan lines 10 disposed on one side of the substrate, the plurality of data lines 20 and the plurality of scan lines 10 defining a plurality of sub-pixel areas, the plurality of data lines 20 and the plurality of scan lines 10 being mutually insulated; a color-resist layer disposed on the same side of the substrate with the plurality of data lines 20 and the plurality of scan lines 10, the color-resist layer comprising a plurality of color-resists 30, and two adjacent color-resists 30 having an overlapping area corresponding to the data line area; a DBS common electrode wire 41 disposed on a side of the overlapping area of the color-resist layer away from the substrate to shield the data line 20, and uniform slits disposed at an edge of the DBS common electrode wire 41 in parallel with direction of the scan line 10.

The pixel structure included in the array substrate mainly comprises: the TFT array disposed on the substrate comprising a horizontal scan line 10 and a longitudinal data line 20, and a color-resist 30 and a pixel electrode (not shown) disposed in a sub-pixel area defined by the intersecting scan line 10 and the data line 20, for example, R, G, B color-resists 30; laterally adjacent color-resists 30 mutually overlapping in the data line area (indicated by a dash line portion in FIG. 2A), and a black matrix 50 being disposed in the scan line area between longitudinally adjacent color-resists 30; a DBS common electrode wire 40 being disposed in parallel above the data line 20, and the DBS common electrode wire 40 being slightly wider than the data lines 20 for achieving shading in the liquid crystal display. The edge of the DBS common electrode wire 41 is disposed with uniform slits 100 in parallel with the direction of the scan line. In the preferred embodiment, the slit 100 is disposed on the edge of each of the upper and lower sides of the DBS common electrode wire 41. The present invention can form the slit pattern of the DBS common electrode wire 41 by the mask definition. The azimuth of the pattern is 0° and 180°, respectively, and the opening direction of the slit 100 is parallel to the scan line direction, and can be oriented in two directions on both sides.

Figure 3A:
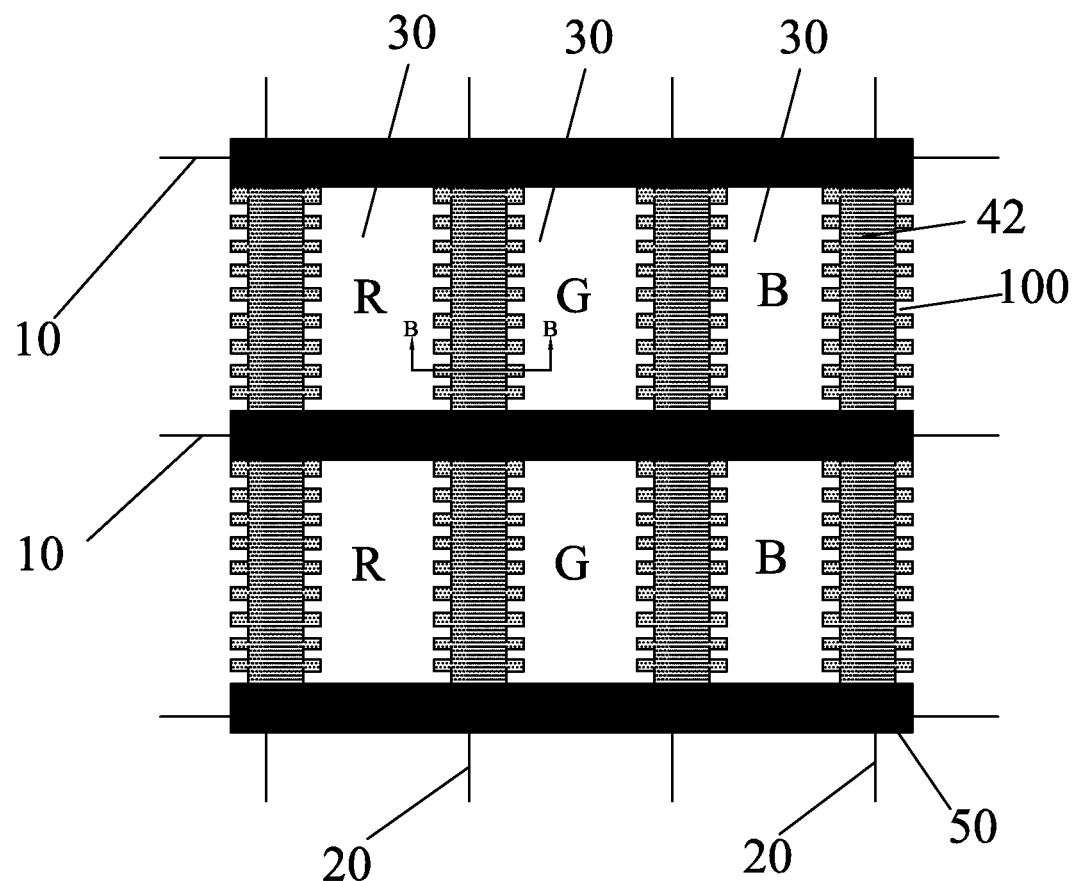
FIG. 3A is a schematic top view of an array substrate of another preferred embodiment of the present invention.

FIG. 3A is a top view of yet another preferred embodiment of the array substrate of the present invention. The structure of the preferred embodiment is substantially the same as that of FIG. 2A. The array substrate of the preferred embodiment mainly includes: a substrate (not shown); a plurality of data lines 20 and a plurality of scan lines 10 disposed on one side of the substrate, the plurality of data lines 20 and the plurality of scan lines 10 defining a plurality of sub-pixel areas, the plurality of data lines 20 and the plurality of scan lines 10 being mutually insulated; a color-resist layer disposed on the same side of the substrate with the plurality of data lines 20 and the plurality of scan lines 10, the color-resist layer comprising a plurality of color-resists 30, and two adjacent color-resists 30 having an overlapping area corresponding to the data line area; a DBS common electrode wire 42 disposed on a side of the overlapping area of the color-resist layer away from the substrate to shield the data line 20, and uniform slits disposed at an edge of the DBS common electrode wire 42 in parallel with direction of the scan line 10.

The DBS common electrode wire 42 is disposed parallel to the data line 20 at the overlapping of the color-resists 30 above the data line 20 to shield the data line 20. The edge of the DBS common electrode wire 42 is provided with uniform slits 100 parallel to the direction of the scan line. In the preferred embodiment, the slits 100 are symmetrically disposed on edges of both sides of the DBS common electrode wire 42. The slits 100 are formed on both sides to improve the LC control effect by the DBS common electrode wire 42.

Figure 3B:
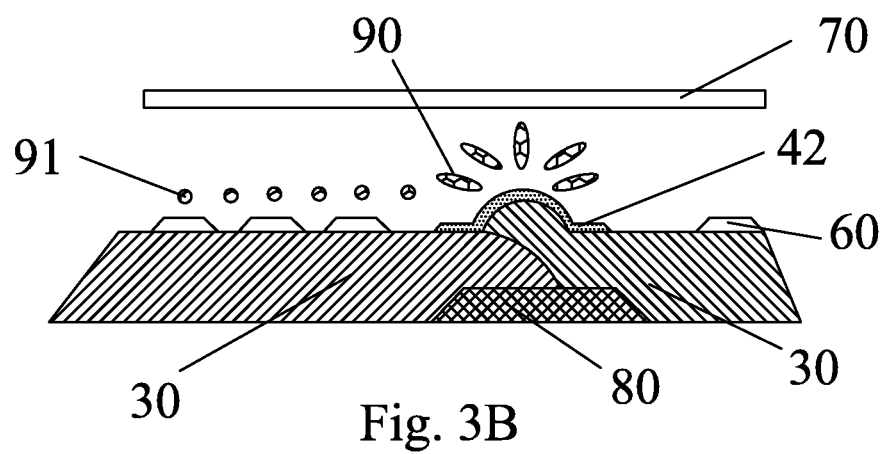
FIG. 3B is a schematic cross-sectional view of B-B position in FIG. 3A.

Refer to FIG. 3B. FIG. 3B is a schematic cross-sectional view of B-B position in FIG. 3A, with structure not shown in FIG. 3A added. The color-resist 30 is formed on the source 80 of the TFT array, and the DBS common electrode wire 42 and a pixel electrode 60 are disposed on the color-resist 30. During operation, the electric field between the pixel electrode 60 and the common electrode 70 deflects the LC molecules 91, and the DBS common electrode wire 42 and the common electrode 70 on the opposite substrate are generally set at the same voltage. The equipotential is set so that the LC molecules 90 remain undeflected during operation. The present invention improves the LC control effect by the DBS common electrode wire 42 through making the slit 100 of the DBS common electrode wire 42 form an azimuth angle of 0° and 180°, and eliminates the light leakage caused by the forward electric field or lateral electric field formed by the terrain topography and the upper and lower substrates at the position.

The slits on the DBS common electrode wire can also be designed in other ways as long as the effect of the DBS common electrode wire to control the liquid crystal can be improved. For example, the DBS common electrode wire may have slits on both sides, and the slits on both sides may be asymmetric; or the DBS common electrode wire may have slits on only one side. The longitudinal distribution ranges of the slits on both sides (or just one side) of the DBS common electrode wire are merged to cover the sub-pixel area where the DBS common electrode wire is located to meet the needs of controlling the LC molecules.

The present invention also provides a manufacturing method of array substrate, which comprises:

providing a substrate, forming a thin film transistor (TFT) array on one side of the substrate; the TFT array maybe adopting a known TFT array structure;

forming a color-resist on a passivation layer of the TFT array; after depositing a passivation layer (PV1) of the TFT array, the RGB color-resists being formed by coating;

forming a via on the color-resist; after forming RGB color-resists, using dry etching or wet etching to form a via to expose the passivation layer of the TFT array; the passivation layer being provided with a via for connecting the pixel electrode to the TFT electrode;

forming an indium-tin-oxide (ITO) film on the color-resist, patterning the ITO film to form a pixel electrode and a DBS common electrode wire, and an edge of the DBS common electrode wire being disposed with uniform slits in parallel with direction of the scan line; the pixel electrode being connected to a drain of the TFT array through the via. The via on the color-resist exposes the passivation layer of the TFT array under the color-resist, and the passivation layer is provided with a via for connecting to the drain, and the pixel electrode is connected to the drain through the via on the color-resist and the via of the passivation layer. The pattern of the DBS common electrode wire can be designed according to the previous embodiment, and the slit pattern is formed by the mask definition. An ITO thin film was formed by sputtering, and a pixel electrode and a DBS common electrode wire pattern were formed by a wet etching process.

The TFT array can be manufactured by a general TFT manufacturing process, and the manufacturing process is Metal1-(G1+a-Si+n+Si)-Metal 2-PV1 process; mainly comprises:

forming a gate metal layer (Metal1) on the substrate and patterning the gate metal layer to obtain a gate;

forming a gate insulating layer (G1) on the gate and the substrate;

forming an active layer (a-Si) on the gate insulating layer;

forming an ohmic contact layer (n+Si) on the active layer; the ohmic contact layer may be formed on the active layer by chemical vapor deposition or the like;

forming a source/drain metal layer (Metal2) on the ohmic contact layer and patterning the source/drain metal layers to obtain a source and a drain;

forming a passivation layer (PV1) on the source and the drain.

In summary, the array substrate and the manufacturing method thereof of the present invention can reduce light leakage at the DBS common electrode wire overlapping the color-resist, improve color gamut and contrast, and improve product quality.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, comprising:

a substrate;

a plurality of data lines and a plurality of scan lines disposed on one side of the substrate, the plurality of data lines and the plurality of scan lines defining a plurality of sub-pixel areas, the plurality of data lines and the plurality of scan lines being mutually insulated, the plurality of data lines extending in a first direction and being arranged in a second direction crossing the first direction, the plurality of scan lines extending in the second direction and being arranged in the first direction;

a color-resist layer disposed on the same side of the substrate with the plurality of data lines and the plurality of scan lines, the color-resist layer comprising a plurality of color-resists, and two adjacent color-resists of the plurality of color-resists having an overlapping area corresponding to an area of a respective one of the plurality of data lines;

a data black matrix (BM) saving (DBS) common electrode wire extending in the first direction and disposed on a side of the overlapping area of the color-resist layer away from the substrate to shield a data line of the plurality of data lines, and a plurality of uniform slits disposed at an edge of the DBS common electrode wire in plan view, the plurality of uniform slits extending in the second direction and being arranged in the first direction.

2. The array substrate as claimed in claim 1, wherein the slits are disposed at the edge of a side of the DBS common electrode wire.

3. The array substrate as claimed in claim 1, wherein the slits are disposed at the edges of both sides of the DBS common electrode wire.

4. The array substrate as claimed in claim 3, wherein the slits are symmetrically disposed at the edges of both sides of the DB S common electrode wire.

5. The array substrate as claimed in claim 3, wherein the slits are asymmetrically disposed at the edges of both sides of the DBS common electrode wire.

6. The array substrate as claimed in claim 1, wherein longitudinal distribution ranges of the slits on both sides of the DBS common electrode wire are merged to cover the sub-pixel area where the DBS common electrode wire is located.

7. The array substrate as claimed in claim 1, wherein the sub-pixel area is disposed with a pixel electrode.

\* \* \* \* \*